United States Patent
Huang et al.

(10) Patent No.: US 10,777,534 B2
(45) Date of Patent: Sep. 15, 2020

(54) THREE-DIMENSIONAL STACKING STRUCTURE

(71) Applicant: Taiwan Semiconductor Manufacturing Co., Ltd., Hsinchu (TW)

(72) Inventors: Peter Yu Fei Huang, Pleasant, CA (US); Chaochieh Tsai, Cupertino, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 201 days.

(21) Appl. No.: 15/686,183

(22) Filed: Aug. 25, 2017

(65) Prior Publication Data

US 2018/0012868 A1    Jan. 11, 2018

Related U.S. Application Data

(62) Division of application No. 15/164,883, filed on May 26, 2016, now Pat. No. 9,748,206.

(51) Int. Cl.
*H01L 23/02*    (2006.01)
*H01L 25/065*    (2006.01)
(Continued)

(52) U.S. Cl.
CPC .... *H01L 25/0657* (2013.01); *H01L 21/02252* (2013.01); *H01L 21/31111* (2013.01); *H01L 23/3185* (2013.01); *H01L 23/5283* (2013.01); *H01L 23/564* (2013.01); *H01L 24/09* (2013.01); *H01L 24/80* (2013.01); *H01L 24/94* (2013.01); *H01L 25/50* (2013.01); *H01L 23/585* (2013.01);
(Continued)

(58) Field of Classification Search
CPC ......... H01L 23/02; H01L 21/00; H01L 23/48; H01L 21/283; H01L 23/58; H01L 21/768; H01L 23/485; H01L 21/74; H01L 21/50; H01L 23/522; H01L 21/60; H01L 21/822; H01L 23/498; H01L 23/538–5389; H01L 23/12–15; H01L 25/043; H01L 25/0657; H01L 25/074; H01L 25/0756; H01L 25/117; H01L 25/0652; H01L 25/071; H01L 25/112
USPC ....... 257/774, 522, 419, 773, 758, 737, 499, 257/762, 764, 506; 438/303, 591, 618, 438/421, 584, 637, 783, 763
See application file for complete search history.

(56) References Cited

U.S. PATENT DOCUMENTS 8,802,504 B1    8/2014  Hou et al.
8,803,292 B2    8/2014  Chen et al.
(Continued)

*Primary Examiner* — Moin M Rahman
(74) *Attorney, Agent, or Firm* — JCIPRNET

(57) ABSTRACT

A three-dimensional stacking structure is described. The stacking structure includes at least a bottom die, a top die and a spacer protective structure. The bottom die includes contact pads in the non-bonding region. The top die is stacked on the bottom die without covering the contact pads of the bottom die and the bottom die is bonded with the top die through bonding structures there-between. The spacer protective structure is disposed on the bottom die and covers the top die to protect the top die. By forming an anti-bonding layer before stacking the top dies to the bottom dies, the top die can be partially removed to expose the contact pads of the bottom die for further connection.

20 Claims, 10 Drawing Sheets

(51) Int. Cl.
  *H01L 23/00* (2006.01)
  *H01L 25/00* (2006.01)
  *H01L 23/31* (2006.01)
  *H01L 23/528* (2006.01)
  *H01L 21/311* (2006.01)
  *H01L 21/02* (2006.01)
  *H01L 23/58* (2006.01)

(52) U.S. Cl.
  CPC ...... *H01L 24/08* (2013.01); *H01L 2224/0401* (2013.01); *H01L 2224/05547* (2013.01); *H01L 2224/05624* (2013.01); *H01L 2224/05647* (2013.01); *H01L 2224/05655* (2013.01); *H01L 2224/08145* (2013.01); *H01L 2224/08147* (2013.01); *H01L 2224/09517* (2013.01); *H01L 2224/94* (2013.01); *H01L 2225/06513* (2013.01); *H01L 2225/06548* (2013.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2008/0290488 A1* | 11/2008 | Masuda ............... B82Y 10/00 257/679 |
| 2010/0025837 A1* | 2/2010 | Shinoda ............. H01L 25/0657 257/686 |
| 2010/0144138 A1* | 6/2010 | Park .................. H01L 21/76816 438/637 |
| 2011/0127670 A1* | 6/2011 | Perng .................... H01L 25/50 257/738 |
| 2011/0250407 A1* | 10/2011 | Kustandi ............... B29C 33/424 428/195.1 |
| 2013/0187268 A1* | 7/2013 | Lin .................. H01L 23/49827 257/737 |
| 2015/0021785 A1* | 1/2015 | Lin ...................... H01L 23/481 257/774 |
| 2015/0380386 A1* | 12/2015 | Vincent .................. H01L 25/50 257/773 |
| 2016/0079222 A1* | 3/2016 | Sato ....................... H01L 25/18 257/738 |

* cited by examiner

THREE-DIMENSIONAL STACKING STRUCTURE

CROSS-REFERENCE TO RELATED APPLICATION

This application is a divisional application of U.S. application Ser. No. 15/164,883, filed on May 26, 2016, now allowed. The entirety of the above-mentioned patent applications is hereby incorporated by reference herein and made a part of this specification.

BACKGROUND

High-density integration of diverse components such as microprocessors, memory, optoelectronics, mixed signal circuits and microelectromechanical systems (MEMS) is a challenging task. One possible solution for high-density integration is three-dimensional stacking, also called three-dimensional integration, of different microelectronic components at the wafer level. The three-dimensional stacking structures offer numerous advantages, including higher density of interconnects, decreased length of interconnects and packaging size or volume reduction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
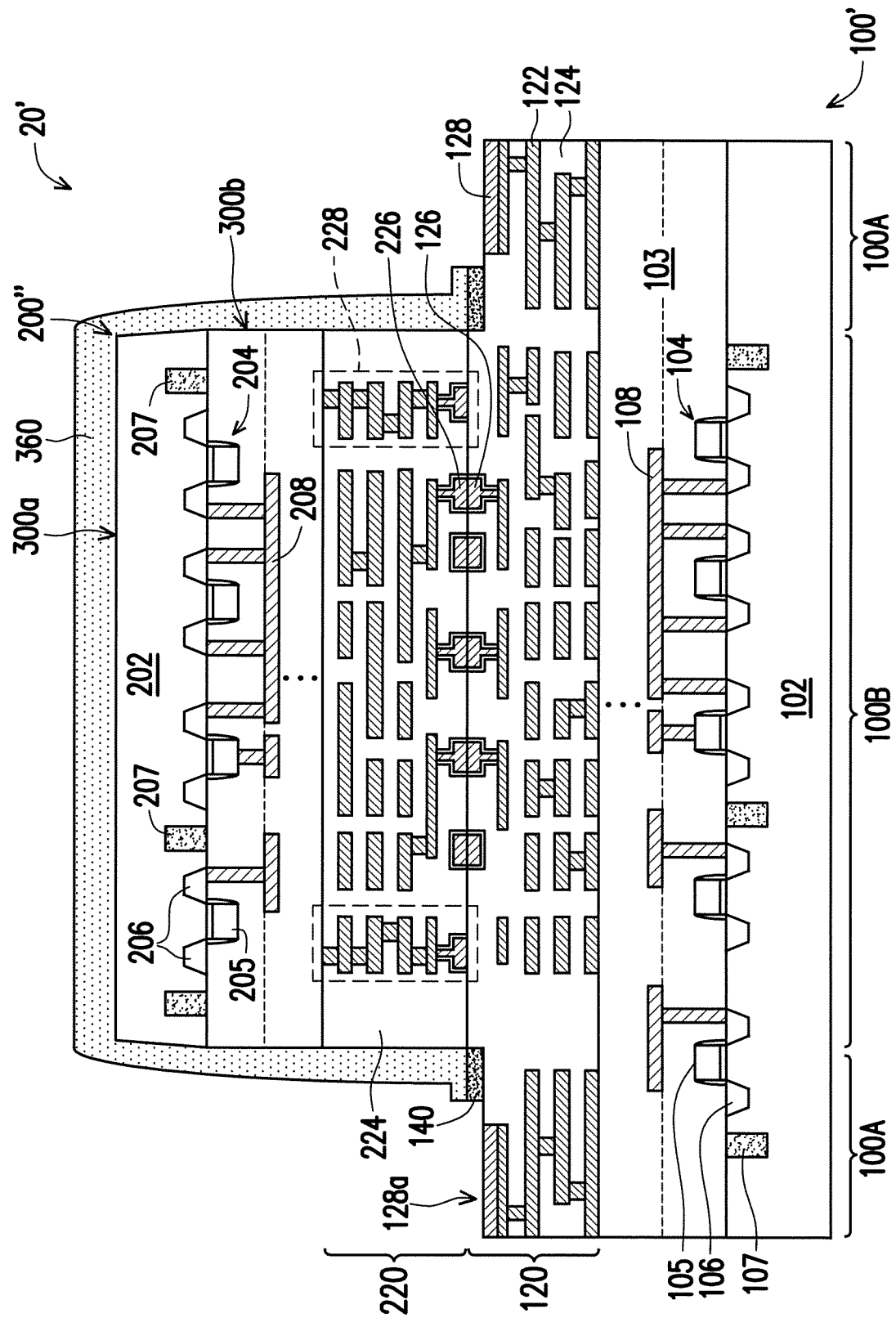
FIG. 1 is a perspective view of a portion of an exemplary three-dimensional stacking structure in accordance with some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The specific embodiment(s) discussed herein is merely illustrative and is related to a three-dimensional (3D) integration structure or assembly, and does not limit the scope of the present disclosure. Embodiments of the present disclosure describe the exemplary manufacturing process of 3D stacking structures and the 3D stacking structures fabricated there-from. Certain embodiments of the present disclosure are related to the 3D stacking structures formed with wafer bonding structures and stacked wafers and/or dies. Other embodiments relate to 3D integration structures or assemblies including post-passivation interconnect (PPI) structures or interposers with other electrically connected components, including wafer-to-wafer assembled structures, die-to wafer assembled structures, package-on-package assembled structures, die-to-die assembled structures, and die-to-substrate assembled structures. The wafers or dies may include one or more types of integrated circuits or electrical components on a bulk semiconductor substrate or a silicon/germanium-on-insulator substrate. The embodiments are intended to provide further explanations but are not used to limit the scope of the present disclosure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 illustrates a cross-sectional view of a portion of an exemplary 3D stacking structure in accordance with some embodiments of the present disclosure. In FIG. 1, the 3D stacking structure 20' comprises at least a first die 100', a second die 200" and a spacer protective structure 360. In some embodiments, the first die 100' includes a first bonding structure 120 comprising bonding elements 126 and contact pads 128. The contact pads 128 are input/output (I/O) pads, bump pads or bond pads, for example. In some embodiments, the second die 200" includes a second bonding structure 220 having bonding elements 226 and at least one seal ring structure 228. In one embodiment, the seal ring structure 228 is arranged along a periphery of the second die 200" and surrounds the bonding elements 226. The second die 200" is stacked on the first die 100', and the second bonding structure 220 is hybrid-bonded with the first bonding structure 120. In some embodiments, the spacer protective structure 360 is disposed on the first die 100' and surrounds the second die 200". In certain embodiments, the spacer protective structure 360 covers sidewalls 300b and the top surface 300a of the second die 200". In one embodiment, the material of the spacer protective structure 360 includes a dielectric material of good gas barrier properties so that the spacer protective structure 360 protects the second die 200" from the moisture. The 3D stacking structure 20' further comprises an anti-bonding layer 140 disposed on the first die 100' and located between the spacer protective structure 360 and the first die 100'. In one embodiment, the material of the anti-bonding layer 140 includes chromium or graphene.

Figure 2A:
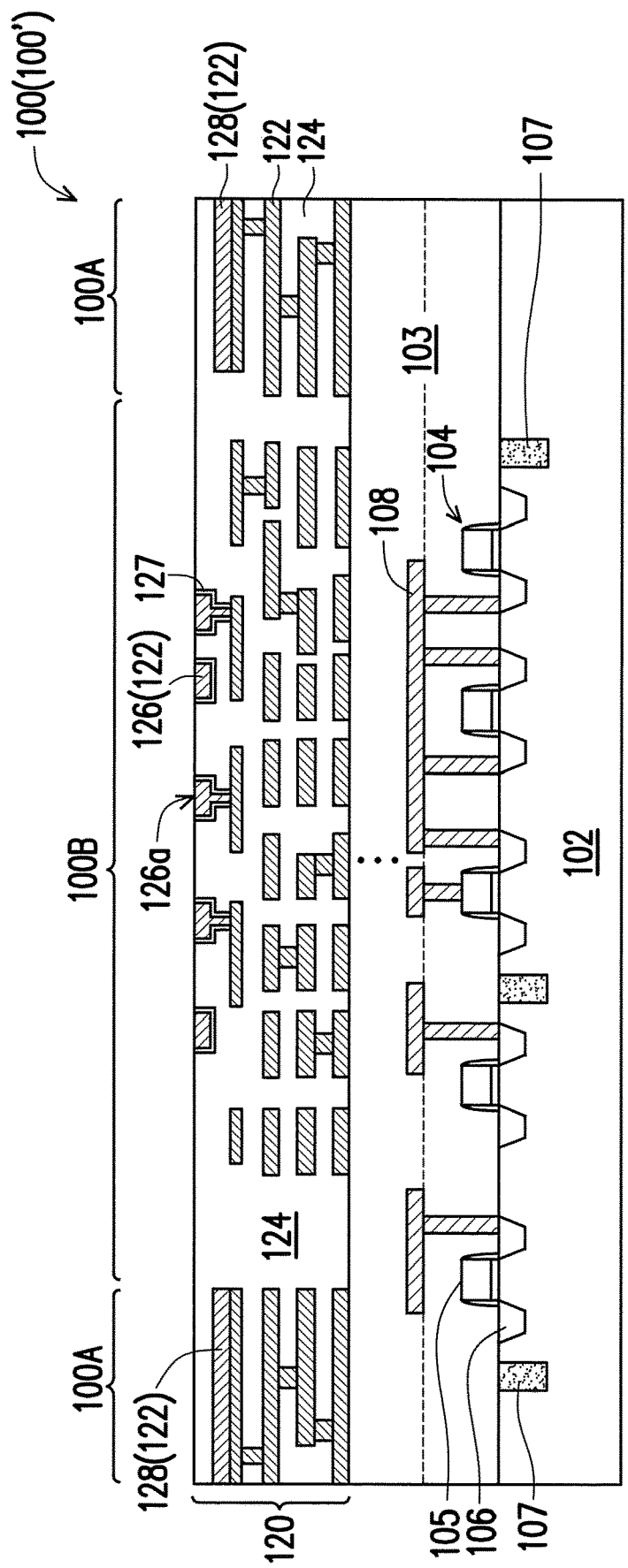
FIGS. 2A-2H are the perspective views and cross-sectional views showing a three-dimensional stacking structure at various stages of the manufacturing method for forming the three-dimensional stacking structure according to some embodiments of the present disclosure.

FIGS. 2A-2H illustrate the cross-sectional views of portions of a 3D stacking structure 20 at various stages of the manufacturing methods for forming the 3D stacking structure according to some embodiments of the present disclosure. In FIG. 2A, in some embodiments, a first wafer 100 including semiconductor devices 104, isolation structures 107 and metallization structures 108 formed in a semiconductor substrate 102 is provided. In some embodiments, the first wafer includes a plurality of first dies 100'. In certain embodiments, the semiconductor devices 104 are formed in the semiconductor wafer 100 during the front-end-of-line (FEOL) processes. In certain embodiments, the first wafer 100 is a semiconductor wafer made of silicon or other semiconductor materials, such as III-V semiconductor materials. In some embodiments, the semiconductor substrate 102 may include elementary semiconductor materials such as silicon or germanium, compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In exemplary embodiments, the semiconductor device 104 embedded in an insulation layer 103 includes a gate structure 105 and active regions 106, located between the isolation structures 107. The semiconductor devices 104 shown in FIG. 2A are merely examples, and other devices may be formed in the first wafer 100. In some embodiments, the semiconductor devices 104 are N-type metal-oxide semiconductor (NMOS) devices and/or P-type metal-oxide semiconductor (PMOS) devices. In some embodiments, the semiconductor devices 104 are transistors, memories or power devices, or other devices such as capacitors, resistors, diodes, photodiodes, sensors or fuses.

As shown in FIG. 2A, in certain embodiments, the metallization structures 108 are embedded within the insulation layer 103 and formed over the semiconductor devices 104. In some embodiments, the insulation layer 103 includes one or more dielectric layers. In some embodiments, a material of the insulation layer 103 includes silicon oxide, a spin-on dielectric material, a low-k dielectric material or a combination thereof. The formation of the insulation layer 103 includes performing one or more processes by chemical vapor deposition (CVD) or by spin-on, for example. In some embodiments, the metallization structures 108 include interconnect structures, such as metal lines, via and contact plugs. In certain embodiments, the materials of the metallization structures 108 include aluminum (Al), aluminum alloy, copper (Cu), copper alloy, tungsten (W), or combinations thereof. In exemplary embodiments, the semiconductor devices 104 are electrically connected with the metallization structures 108 and some of the semiconductor devices 104 are electrically interconnected through the metallization structures 108. The metallization structures 108 shown herein are merely for illustrative purposes, and the metallization structures 108 may include other configurations and may include one or more through vias and/or damascene structures.

As shown in FIG. 2A, in some embodiments, a hybrid bonding structure 120 is formed over the insulation layer 103 and the metallization structures 108. In exemplary embodiments, the hybrid bonding structure 120 includes conductive features 122 embedded in a dielectric material 124. In some embodiments, the conductive features 122 include at least bonding elements 126 located within the bonding region 100B of the first wafer 100 and contact pads 128 located within the non-bonding region 100A of the first wafer 100. The contact pads 128 are input/output (I/O) pads, bump pads or bond pads, for example. In exemplary embodiments, the non-bonding region 100A is an I/O region of the first wafer 100, and the contact pads 128 are I/O pads. Alternatively, in some embodiments, the non-bonding region 100A is an I/O region of the first wafer 100, and the contact pads 128 are bump pads. In one embodiment, the top surfaces 126a of the bonding elements 126 are exposed from the dielectric material 124, for wafer bonding. In one embodiment, the contact pads 128 are embedded and covered by the dielectric material 124. Although not expressly shown in FIG. 2A, some of the conductive features 122 are electrically interconnected to one another and some of the conductive features 122 are electrically connected with the underlying metallization structures 108 and/or the semiconductor devices 104.

In exemplary embodiments, the conductive features 122 are made of conductive materials, such as copper (Cu), copper alloys, aluminum (Al), aluminum alloys, nickel (Ni), solder materials or combinations thereof. In some embodiments, if the conductive material is copper or copper alloy, which is easy to diffuse, a diffusion barrier layer 127 is needed. In FIG. 2A, in certain embodiments, the bonding element 126 is made of copper or copper alloys, and the diffusion barrier layer 127 is formed between the bonding element 126 and the dielectric material 124. The material of the diffusion barrier layer 127 includes silicon nitride (SiN), silicon oxynitride (SiON), titanium (Ti), titanium nitride (TiN), tantalum (Ta), tantalum nitride (TaN), aluminum nitride (AlN) or cobalt alloys. In some embodiments, the conductive material of the bonding element 126 is copper, and the diffusion barrier layer 127 is made of Ti, TiN, Ta, TaN, Ta/TaN, CoP or CoW.

In some embodiments, the dielectric material 124 is made of silicon oxide, silicon nitride, benzocyclobutene (BCB), epoxy, polyimide (PT), or polybenzoxazole (PBO). In certain embodiments, the dielectric material 124 is made of silicon oxide or silicon nitride. In certain embodiments, the dielectric material 124 is made of benzocyclobutene (BCB) by spin coating. When a soft polymer material(s), such as BCB polymer, is used, the hybrid bonding structure can be more tolerant to the stress, thus enhancing the reliability of the 3D stacking structure.

As the devices in the vicinity of through-substrate vias (TSVs) often suffer from serious performance degradation due to the stress induced by the TSV, the hybrid bonding structure described in the above embodiments is not formed with the TSV, even though the hybrid bonding structure may be compatible with TSVs.

Figure 2B:
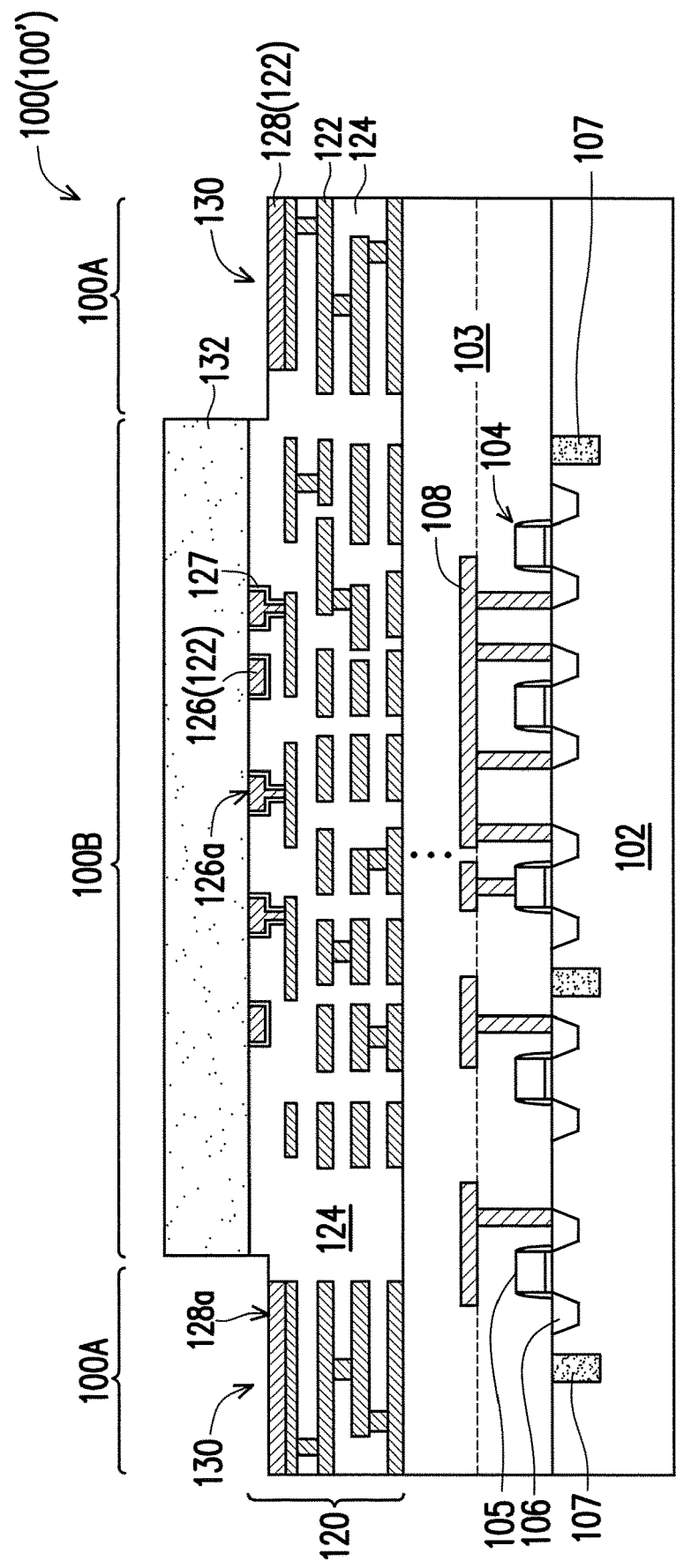

FIG. 2B is a partial cross-sectional view of the 3D stacking structure at one of various stages of the manufacturing method. As shown in FIG. 2B, in exemplary embodiments, the non-bonding regions 100A of the first wafer 100 is patterned to form shallow openings 130, and top surfaces 128a of the contact pads 128 are exposed by the openings 130. In some embodiments, the bonding region(s) 100B is covered by a mask pattern 132, and using the mask pattern 132 as an etching mask, the non-bonding regions 100A are patterned and etched to a depth enough to expose the contact pads 128. In one embodiment, the patterning of the non-bonding regions 100A and the formation of the shallow openings 130 include performing at least one anisotropic etching process.

Figure 2C:
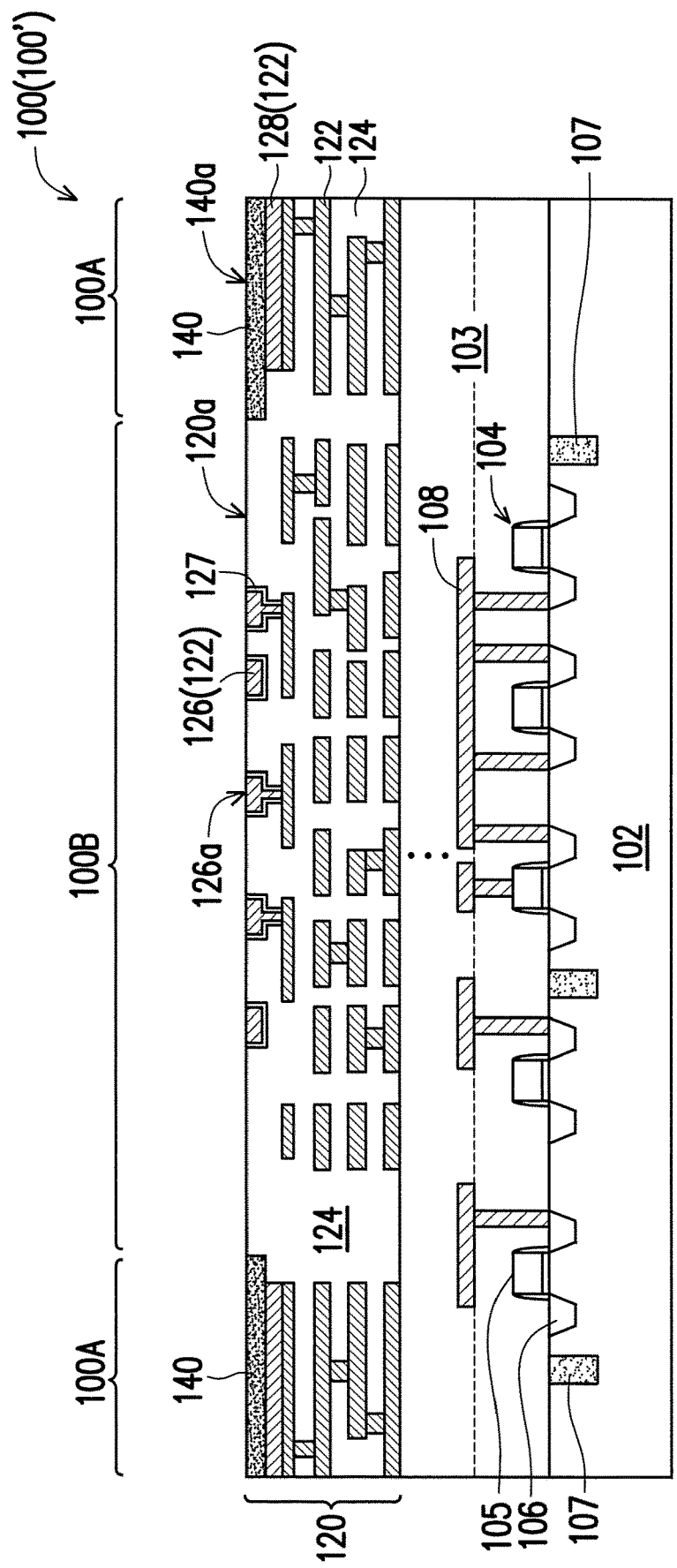

FIG. 2C is a partial cross-sectional view of the 3D stacking structure at one of various stages of the manufacturing method. As shown in FIG. 2C, in exemplary embodiments, an anti-bonding layer 140 is formed within the openings 130 and fills up the openings 130. In one embodiment, the anti-bonding layer 140 are least covers the contact pads 128 and may extend beyond the contact pads 128. In some embodiments, the top surface 140a of the anti-bonding layer 140 levels with the top surface 120a of the hybrid bonding structure 120. In one embodiment, the material of the anti-bonding layer 140 includes chromium or graphene. In some embodiment, the anti-bonding layer 140 functions to prevent bonding between the non-bonding regions 100A of the first wafer 100 and another wafer or die thereon. In some embodiments, after forming the anti-bonding layer 140, the mask pattern 132 (FIG. 2B) is removed and the top surface 120a of the hybrid bonding structure 120 (including the top surfaces 126a of the bonding elements 126) in the bonding region 100B is exposed. In certain embodiments, a surface activation process is optionally performed to prepare the top surface 120a of the hybrid bonding structure 120 (including the top surfaces 126a of the bonding elements 126) ready for wafer bonding.

Figure 2D:
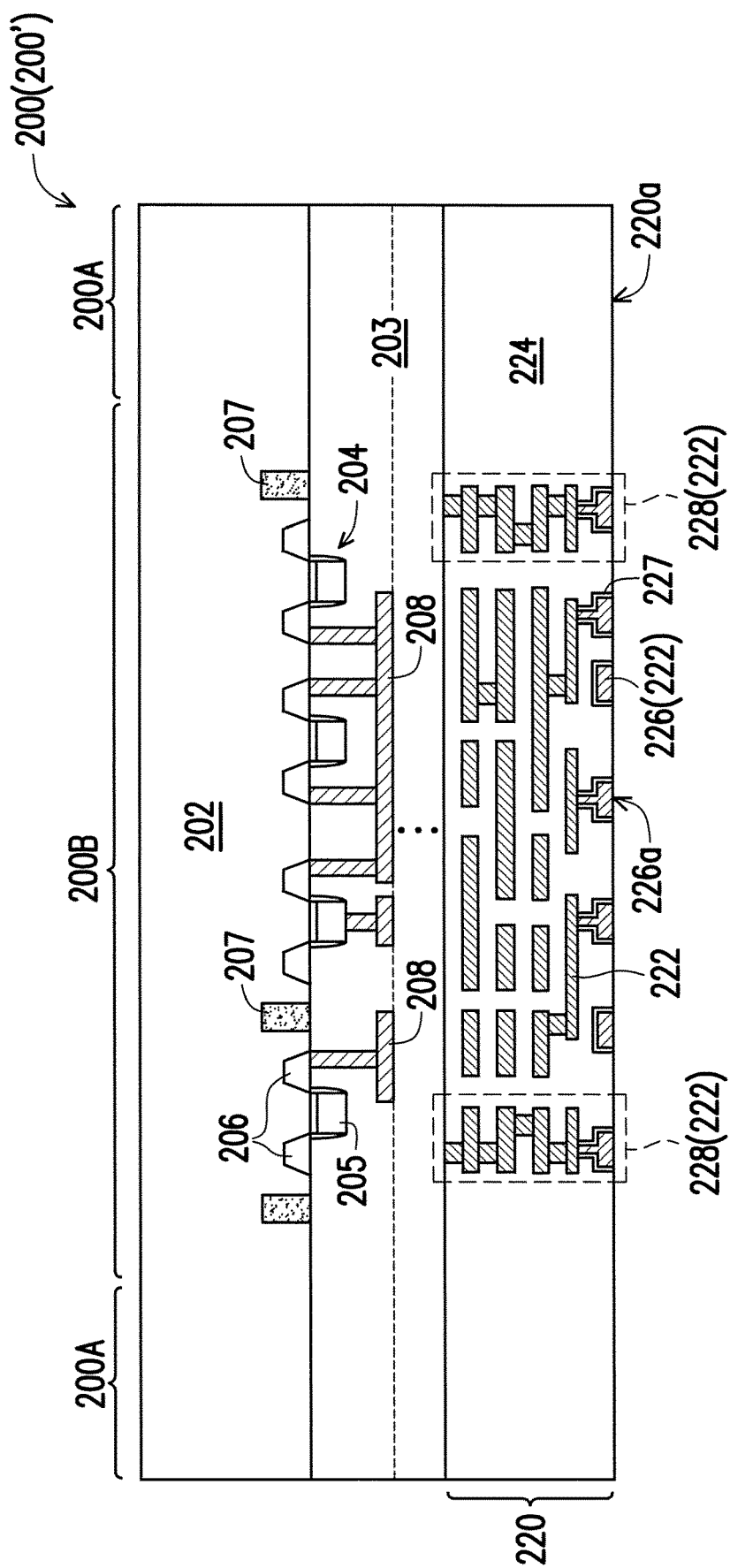

FIG. 2D is a partial cross-sectional view of the 3D stacking structure at one of various stages of the manufacturing method. As shown in FIG. 2D, a second wafer 200 is provided. In some embodiments, the second wafer is a semiconductor wafer, made of a semiconductor material similar to or different from that of the first wafer 100. In alternative embodiments, the second wafer 200 may be regarded as one or more second dies 200'. The second wafer 200 includes semiconductor devices 204, isolation structures 207 and metallization structures 208 formed in a semiconductor substrate 202. In some embodiments, the semiconductor substrate 202 is similar to the semiconductor substrate 102. In exemplary embodiments, the semiconductor device 204 embedded in an insulation layer 203 includes a gate structure 205 and active regions 206 located between the isolation structures 207. The semiconductor devices 204 shown in FIG. 2D are merely examples, and semiconductor devices 204 may be similar to the semiconductor devices 104 or may be different types of semiconductor devices.

As shown in FIG. 2D, the second wafer 200 further includes metallization structures 208 embedded in the insulation layer 203 and a hybrid bonding structure 220 over the insulation layer 203 and the metallization structures 208. In some embodiments, the insulation layer 203 includes one or more dielectric layers. In some embodiments, a material of the insulation layer 203 includes silicon oxide, a spin-on dielectric material, a low-k dielectric material or a combination thereof. The formation of the insulation layer 103 includes performing one or more processes by CVD or by spin-on, for example. The material of the insulation layer 203 may be the same with or different from that of the insulation layer 103. In some embodiments, the metallization structures 208 include interconnect structures, such as metal lines, via and contact plugs. In certain embodiments, the materials of the metallization structures 208 include aluminum, aluminum alloy, copper, copper alloy, tungsten, or combinations thereof. In exemplary embodiments, the semiconductor devices 204 are electrically connected with the metallization structures 208 and some of the semiconductor devices 204 are electrically interconnected through the metallization structures 208. The configurations and arrangement of the metallization structures 208 are similar to or different from those of the metallization structures 108, as the semiconductor devices 104 and 204 may be similar or different. The metallization structures 208 shown herein are merely for illustrative purposes and the metallization structures 208 may include other configurations and may include one or more through vias and/or damascene structures.

In FIG. 2D, in some embodiments, the hybrid bonding structure 220 includes conductive features 222 embedded in a dielectric material 224. In some embodiments, the conductive features 222 include at least bonding elements 226 and seal ring structure(s) 228 located within the bonding region(s) 200B of the second wafer 200. In certain embodiments, the seal ring structure(s) 228 is arranged along the periphery of the bonding region 200B to surround the bonding region 200B and between the bonding region 200B and the non-bonding regions 200A. In one embodiment, the seal ring structure 228 embedded within the dielectric material 224 of the hybrid bonding structure 220 includes a ring pattern surrounding the second bonding elements. The hybrid bonding structure 220 has no conductive features 222 arranged within the non-bonding region 200A of the second wafer 200. In exemplary embodiments, the bonding region 200B is a device region and the non-bonding region(s) 200A is a peripheral region. The conductive features 222 are made of conductive materials, such as Cu, copper alloy, Al, aluminum alloy, or combinations thereof. In some embodiments, the bonding element 226 is made of copper or copper alloys, and a diffusion barrier layer 227 is formed between the bonding element 226 and the dielectric material 224. The material of the dielectric material 224 is similar to that of the dielectric material 124. Alternatively, in other embodiments, the material of the dielectric material 224 may be different to that of the dielectric material 124, as long as the dielectric materials 124, 224 can establish satisfactory bonding.

As shown in FIG. 2D, in certain embodiments, the top surfaces 226a of the bonding elements 226 are exposed from the dielectric material 224, for wafer bonding in the subsequent processes. In certain embodiments, a surface activation process is optionally performed to prepare the top surface 220a of the hybrid bonding structure 220 ready for wafer bonding. Although not expressly shown in FIG. 2D, some of the conductive features 222 are electrically interconnected to one another and some of the conductive features 222 are electrically connected with the underlying metallization structures 208 and/or the semiconductor devices 204. The configurations and arrangement of the conductive features 222 in the hybrid bonding structure 220 of the second wafer 200 are different from those of the conductive features 122 in the hybrid bonding structure 120 of the first wafer 100. That is, the footprint of the first wafer 100 is different from the footprint of the second wafer 200.

During the wafer on wafer bonding process, if the top wafer (or die) and the bottom wafer (or die) have to adopt the same footprint, the design flexibility is quite limited and the TSVs are often needed for bonding. Alternatively, as described in certain embodiments of the present disclosure, since the top wafer (or die) and the bottom wafer (or die) have different footprints, the design flexibility is improved and costly TSVs are unnecessary.

Figure 2E:
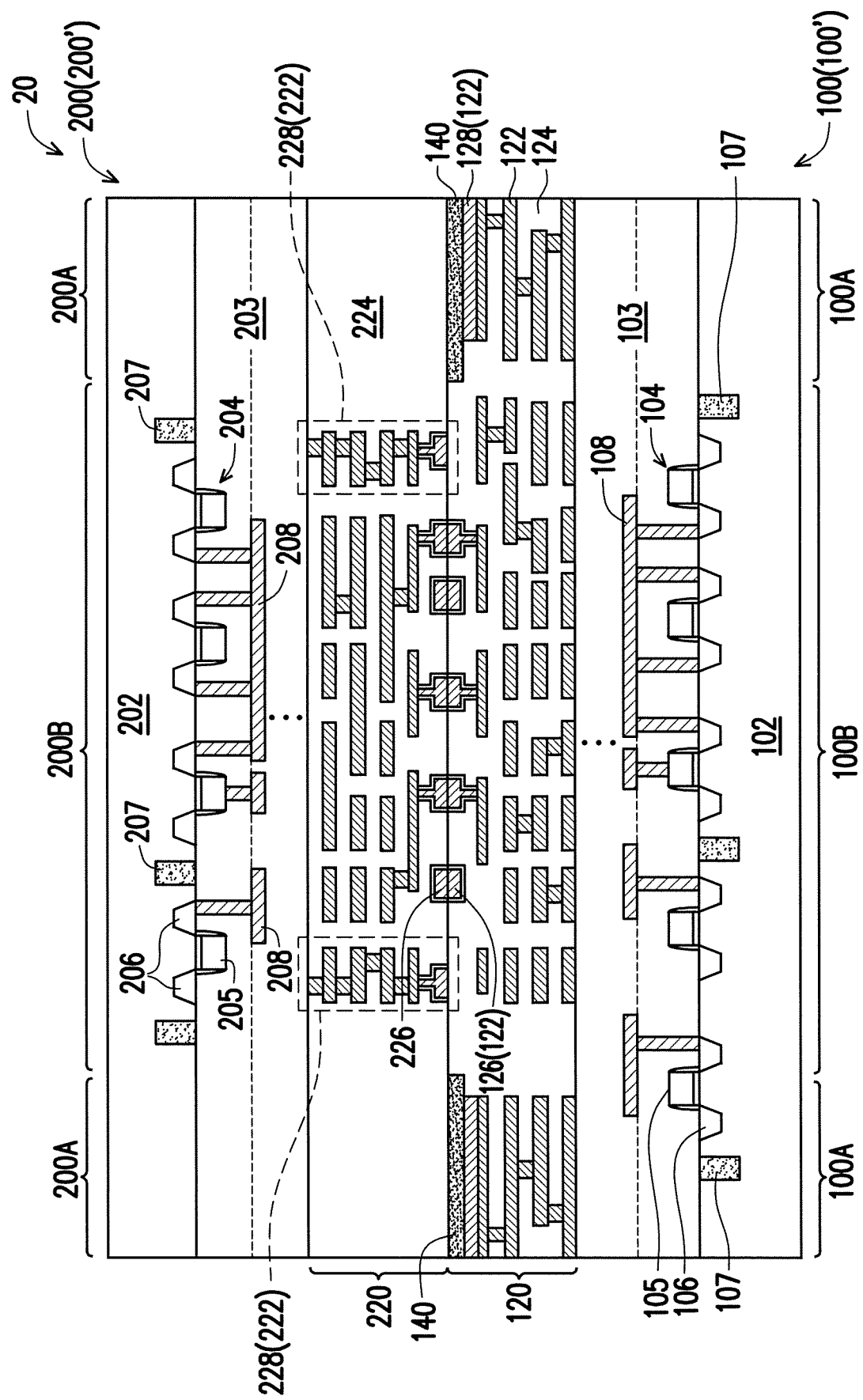

FIG. 2E is a partial cross-sectional view of the 3D stacking structure 20 at one of various stages of the manufacturing method. As shown in FIG. 2E, in some embodiments, the second wafer 200 is stacked over the first wafer 100, and the top surfaces 220a, 120a (shown in FIGS. 2C &

2D) of the hybrid bonding structures 220 and 120 are in direct contact with each other. In certain embodiments, the first and second wafers 100 and 200 are aligned and then stacked in a way that the hybrid bonding structure 220 of the second wafer 200 can be bonded, face-to-face, with the hybrid bonding structure 120 of the first wafer 100. In some embodiments, the alignment of the first and second wafers 100 and 200 comprises using an optical alignment method with infrared (IR) light. In some embodiments, through the alignment, at least the bonding elements 226 (the top surface 226a) of the hybrid bonding structure 220 in the bonding region 200B of the second wafer 200 are in contact with the bonding elements 126 (the top surface 126a) of the hybrid bonding structure 120 in the bonding region 100B of the first wafer 100, even though the footprint of the second wafer 200 is different to that of the first wafer 100. In certain embodiments, through the alignment, the dielectric material 224 of the hybrid bonding structure 220 in the non-bonding regions 200A of the second wafer 200 is in direct contact with the anti-bonding layer 140 arranged in the non-bonding regions 100A of the first wafer 100, However, the dielectric material 224 of the hybrid bonding structure 220 in the non-bonding regions 200A of the second wafer 200 is not bonded to the anti-bonding layer 140, as the anti-bonding layer 140 impart anti-bonding effects between the anti-bonding layer 140 and the dielectric material 224 of the hybrid bonding structure 220.

Referring to FIG. 2E, in certain embodiments, after the alignment and stacking, the first and second wafers 100 and 200 are bonded together by hybrid bonding technology. In some embodiments, the first and second wafers 100 and 200 are bonded by applying heat and/or force. In one embodiments, during the application of hybrid bonding technology, a low temperature heating process at a temperature of about 100° C. to about 200° C. is performed to heat and bond the dielectric materials 124 and 224 of the hybrid bonding structures 120, 220 and a high temperature heating process is performed at a temperature of about 200° C. to about 300° C. to heat the bonding elements 126, 226 of the hybrid bonding structures 120, 220 in the bonding regions 100B, 200B, such that the conductive bonding elements 126, 226 are bonded and the dielectric materials 124 and 224 are cured. In alternative embodiments, the first and second wafers 100, 200 may be bonded through dielectric bonding technology such as polymer bonding and oxide fusion bonding, metallic bonding technology such as thermo-compression bonding and eutectic bonding or the combinations thereof.

Referring to FIG. 2E, in some embodiments, after the hybrid bonding of the first and second wafers 100, 200, a thinning process is performed to a bottom side of the second wafer 200 to remove a portion of the substrate 202 without exposing the semiconductor devices 204. In certain embodiments, the thinning process includes a grinding operation and/or a chemical mechanical polishing (CMP) process. In one embodiment, an isotropic etching process is optionally performed to remove the defects resultant from the previous processes. In alternative embodiments, if a die 200', instead of the second wafer 200, is provided for stacking, the thinning process may be performed before the bonding of the first and second wafers 100 and 200. On the other hand, when the first and second wafer are bonded to form a more robust structure before the thinning process, a better thinning process is performed with higher reliability and the second wafer 200 may be thinned down to a smaller thickness (such as less than 2 microns), thus further reducing the height of the 3D stacking structure 20.

Figure 2F:
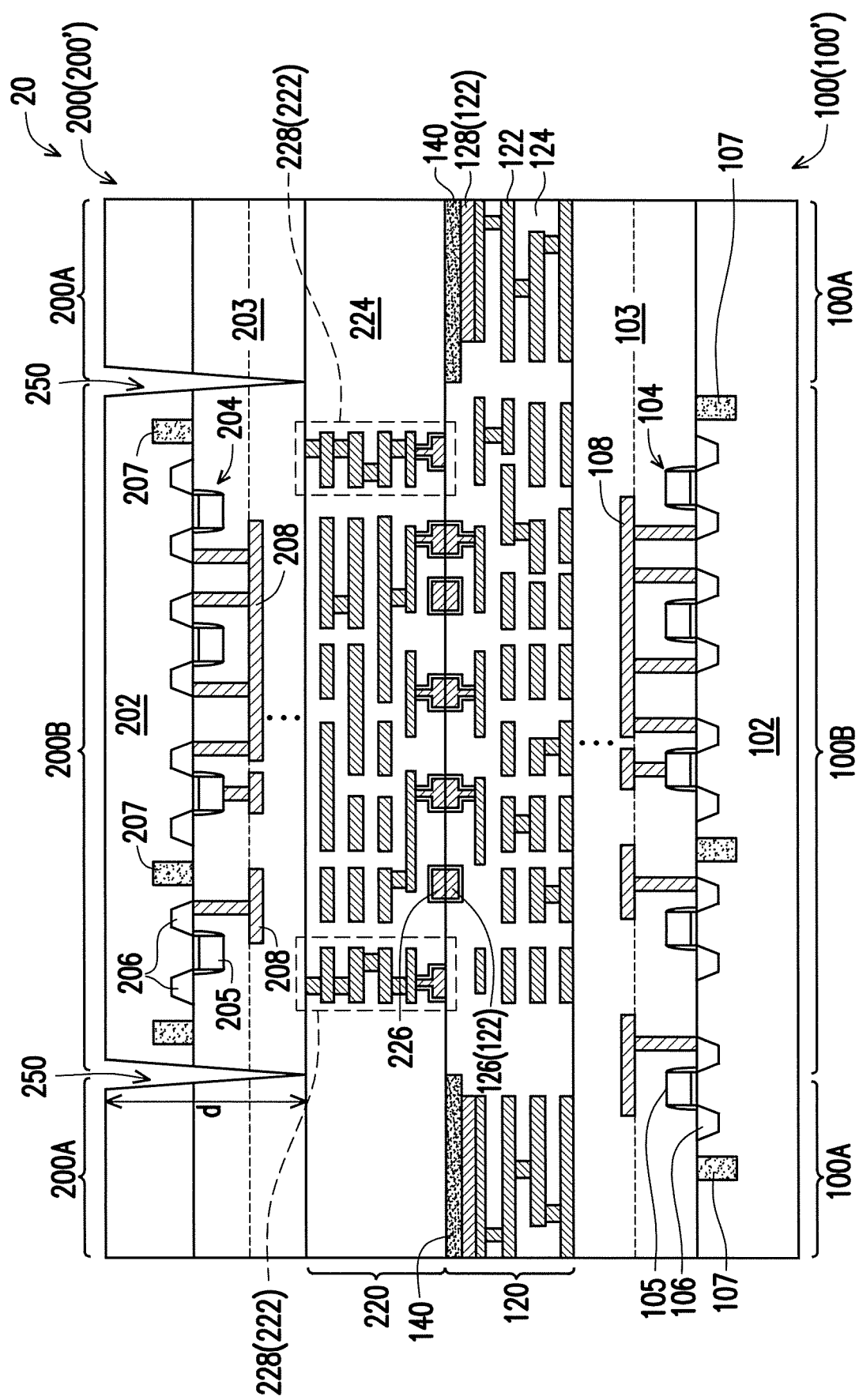

FIG. 2F is a partial cross-sectional view of the 3D stacking structure 20 at one of various stages of the manufacturing method. As shown in FIG. 2F, in some embodiments, after the stacking and bonding of the first and second wafers 100, 200, in some embodiments, a grooving process is performed to the second wafer 200 (or dies 200') to form grooves 250 between the bonding region 200b and the non-bonding region(s) 200A and along the periphery of the non-bonding regions 200A. In certain embodiments, the grooving process includes performing one or more laser cutting processes. In one embodiment, the laser cutting process is performed several times with an infrared laser such as an Nd-YAG (neodymium-doped yttrium aluminum garnet) laser. In certain embodiments, the grooves 250 are formed along the predetermined inscribing lanes of the wafer with a depth d, which is deep enough so as to remove certain portions of the second wafer 200 in the subsequent processes. In alternative embodiments, the grooving process includes a mechanical cutting process, an inscribing process or an etching process.

Figure 2G:
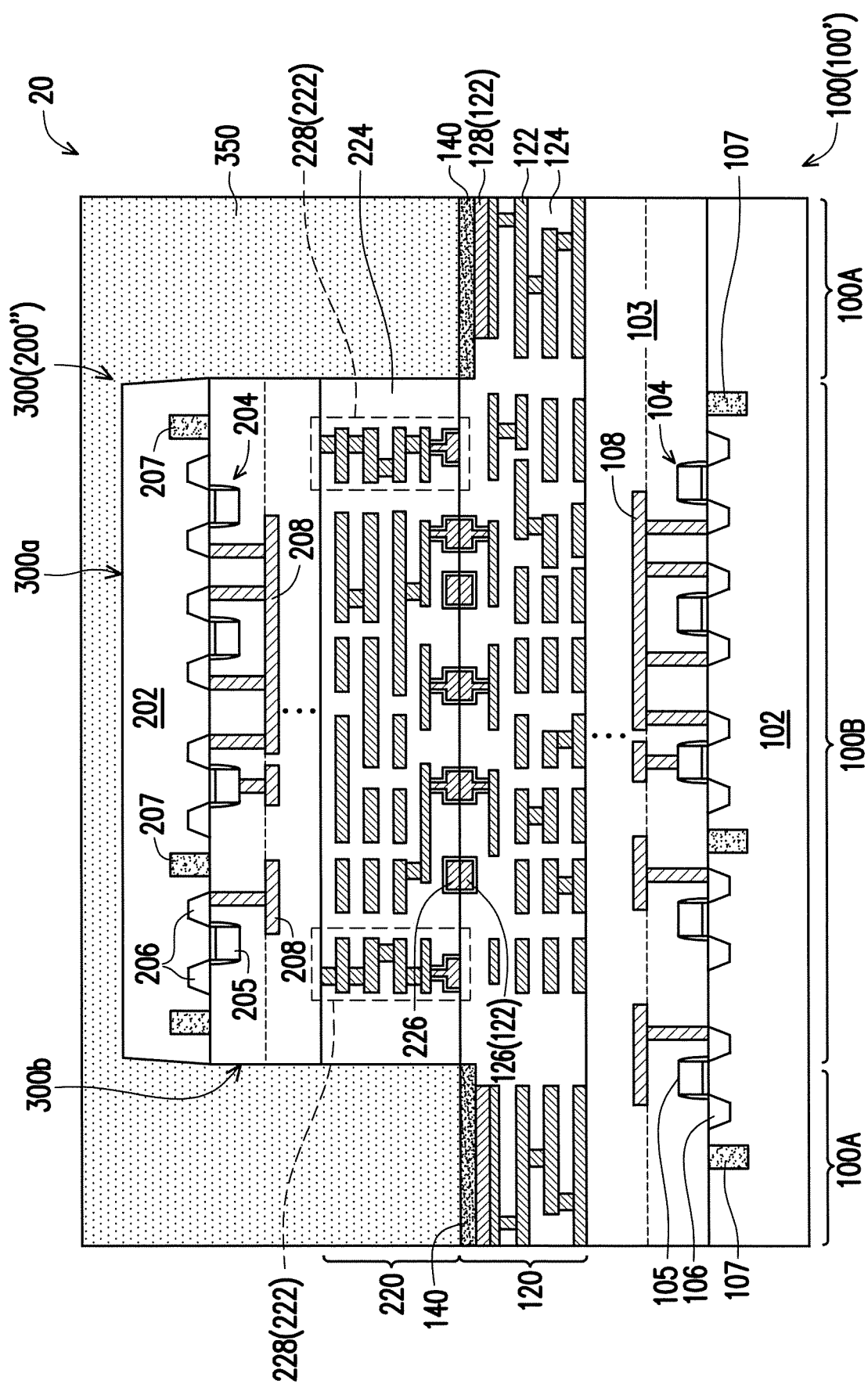

FIG. 2G is a partial cross-sectional view of the 3D stacking structure 20 at one of various stages of the manufacturing method. As shown in FIG. 2G, in some embodiments, the non-bonding regions 200A of the second wafer 200 (or dies 200') are removed from the second wafer 200 along the grooves 250 by a compressing process performed to the second wafer 200 (shown in FIG. 2F). In certain embodiments, the compressing process includes a mechanical cleaving process, an ultrasonic cleaving process or other suitable stressing processes. Referring to FIG. 2G, in certain embodiments, through the formation of the grooves 250 between the bonding region 200B and the non-bonding region(s) 200A and along the periphery of the non-bonding regions 200A, the non-bonding regions 200A of the second wafer 200 are effectively and precisely removed and the remained second wafer becomes the incised structure(s) 300 and the anti-bonding layer 140 overlying the contact pads 128 in the non-bonding regions 100A is exposed. In addition, in some embodiments, the seal ring structures 228 embedded within the second wafer 200 are able to ensure the removal of the non-bonding regions 200A without damaging the bonding elements 226 or the bonding regions 200B of the second wafer 200. In some embodiments, as shown in FIG. 2G, a material layer 350 is formed over the incised structure 300, at least covering the sidewalls 300b and top surface 300a of the incised structure 300 and the anti-bonding layer 140. In exemplary embodiments, the material layer 350 includes a dielectric material of good gas barrier properties. In some embodiment, the dielectric material of good gas barrier properties includes silicon nitride, silicon oxynitride or other suitable dielectric materials, and the dielectric material of the gas barrier properties is formed by plasma enhanced chemical vapor deposition (PECVD).

In exemplary embodiments, the incised structure 300 refers to the remained second wafer 200 or the incised dies 200" by removing (cutting off) the non-bonding regions 200A of the second wafer 200 or the die 200'. In one embodiment, in FIG. 2G, the seal ring structure 228 of the second bonding structure 220 is located along the periphery of the incised structure 300 (the incised second wafer) and surrounds the second bonding elements 226. In certain embodiments, the size of the second wafer 200 is equivalent to or smaller than the size of the first wafer 100, and after the compressing process removing the non-bonding regions 200A, the incised structure 300 (the cut second wafer) becomes smaller in sizes than the first wafer 100. Alternatively, when one or more dies 200' (only one is shown) are stacked on the first wafer 100, the size of the incised die(s) 200" becomes smaller after the compressing process.

Figure 2H:
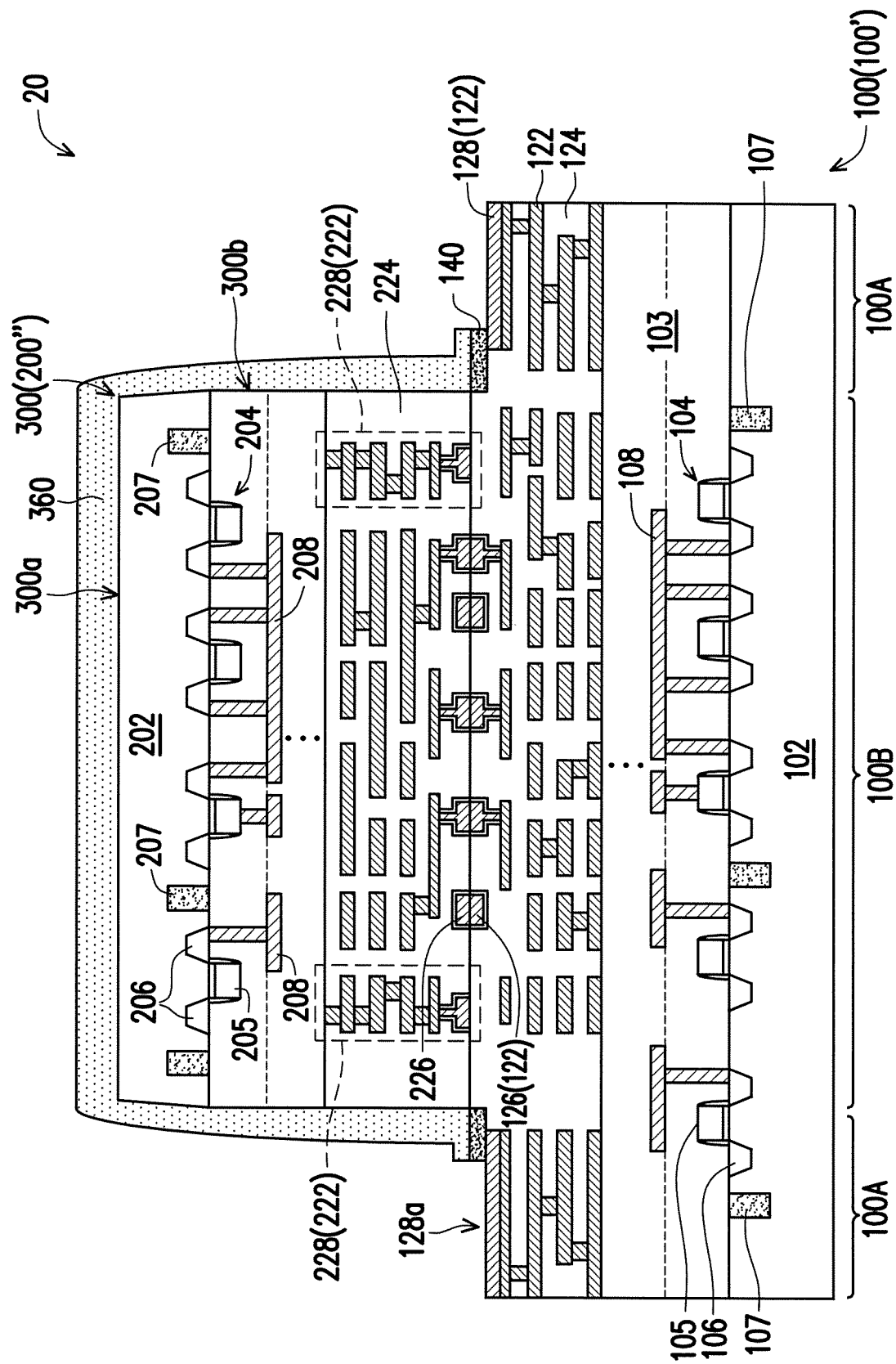

FIG. 2H is a partial cross-sectional view of the 3D stacking structure 20 at one of various stages of the manufacturing method. As shown in FIG. 2H, in some embodiments, the material layer 350 is etched by performing an etching back process to partially remove the material layer 350 over the incised structure 300 to form a spacer protective structure 360 around the incised structure 300 and remove the material layer 350 and the anti-bonding layer 140 above the contact pads 128 to expose the contact pads 128 for further connection. In some embodiments, the etching back process includes one or more isotropic etching processes and/or anisotropic etching processes. In certain embodiments, the etching rate and etching selectivity of the material layer 350 to the anti-bonding layer 140 or to the contact pads 128 are finely tuned so that the material layer 350 and the anti-bonding layer 140 on the contact pads 128 are removed together, leaving the top surfaces 128a of the contact pads 128 exposed. In exemplary embodiments, the spacer protective structure 360 is formed like a hat or a cap on the sidewalls 300b and on the top surface 300a of the incised structure 300, protecting the incised structure 300 of the 3D stacking structure 20 from outside moisture or oxidation. In some embodiments, during the etching back process, a portion of the anti-bonding layer 140 under the spacer protective structure 360 is not removed and remained between the first wafer 100 and the spacer protective structure 360. In FIG. 2G, in one embodiment, the top surfaces 128a of the contact pads 128 are mostly exposed (i.e. not covered by the material layer 350 and the remained anti-bonding layer 140) and a portion of the anti-bonding layer 140 remains on the contact pads 128. That is, the top surfaces 128a of the contact pads 128 are exposed from the first bonding structure 120 and the anti-bonding layer 140 located on the contact pads prevents bonding between the spacer protective structure 360 and the contact pads 128. In some embodiments, a dicing process is subsequently performed to further dice the 3D stacking structure 20 into individual stacking structures 20.

In alternative embodiments, the top surfaces 128a of the contact pads 128 are exposed from the first bonding structure 120 and the remained anti-bonding layer 140 is not in contact with the contact pads 128 (as shown in the individual 3D stacking structure 20' in FIG. 1) when a larger distance between the contact pads 128 and the incised structure 300 is kept.

In exemplary embodiments, as the material layer 350 and the anti-bonding layer 140 above the contact pads 128 are both removed during the etching back process, the contact pads 128 of the first wafer 100 are exposed and further connections structures such as pillars, bumps or solder balls may be formed thereon for external electrical connection. Alternatively, the 3D stacking structure 20 may be additional processed in the subsequent processes to be connected with further connection structures before dicing, and these subsequent processes may be modified based on the product design and will not be described in details herein.

In some embodiments described herein, the contact pads 128 of the first wafer 100 are allowed for bonding or for further connection by removing the non-bonding region(s) 200A of the second wafer 200 above the contact pads 128 of the first wafer 100 and by removing the anti-bonding layer 140 on the contact pads 128 during the formation of the spacer protective structure 360.

In some embodiments described herein, following the removal of the non-bonding region(s) of the top wafer or die, the contact pads such as bump pads or I/O pads in the bottom wafer or die are exposed so that bumps, balls or connection elements are subsequently formed thereon for electrical connection. By doing so, the footprints of the top wafer or die do not have to be the same as the footprints of the bottom wafer or die and no TSVs are required for connecting the contact pads. As described in certain embodiments, during the wafer on wafer bonding process, because the footprints of the top wafer (or die) are independent to the footprints of the bottom wafer (or die), the design flexibility is improved. Additionally, the spacer protective structure(s) formed around the incised structure (or cut dies) shields off the outside moisture and protects the open edges of the incised structure of the 3D stacking structure, leading to better reliability and a more robust structure.

Figure 3:
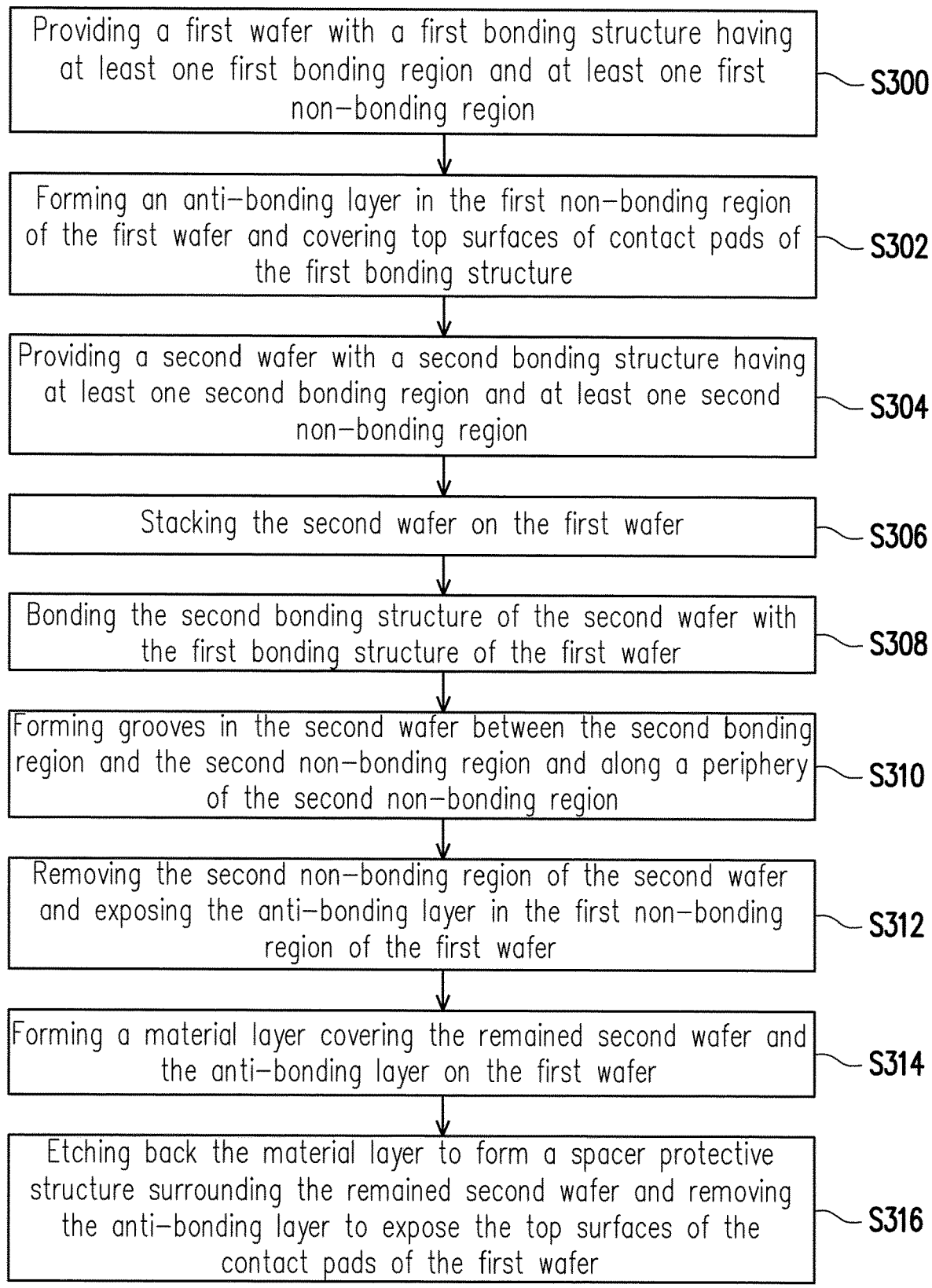
FIG. 3 is an exemplary flow chart showing the process steps of the manufacturing method for forming a three-dimensional stacking structure in accordance with some embodiments of the present disclosure.

FIG. 3 is an exemplary flow chart showing some of the process steps of the manufacturing method for a 3D stacking structure in accordance with some embodiments of the present disclosure. In Step 300, a first wafer with a first bonding structure is provided, and the first wafer has at least one first bonding region and at least one first non-bonding region. In Step 302, an anti-bonding layer is formed in the non-bonding region of the first wafer and covers top surfaces of contact pads of the first bonding structure. In Step 304, a second wafer with a second bonding structure is provided, and the second wafer has at least one second bonding region and at least one second non-bonding region. In Step 306, the second wafer is stacked on the first wafer. In Step 308, the second bonding structure of the second wafer is bonded with the first bonding structure of the first wafer. In Step 310, grooves are formed in the second wafer between the second bonding region and the second non-bonding region and along a periphery of the second non-bonding region. In Step 312, the second non-bonding region of the second wafer is removed and the anti-bonding layer in the first non-bonding region of the first wafer is exposed. In Step 314, a material layer is formed covering the remained second wafer and the anti-bonding layer in the at least one first non-bonding region of the first wafer. In Step 316, the material layer is etched to form a spacer protective structure surrounding the remained second wafer and the anti-bonding layer is removed to expose the top surfaces of the contact pads in the at least one first non-bonding region of the first wafer. In some embodiments, a dicing process is performed to the 3D stacking structure to form the individual stacking structures.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In the above embodiments, as the anti-bonding layer is formed over the contact pads of the first wafer, the non-bonding region of the second wafer is removed and easily detaching from the first wafer. In some embodiments, the anti-bonding layer protects the contact pads, and during etching back of the material layer, portions of the anti-bonding layer and the material layer are removed together to form the spacer protective structure and to expose the contact pads. Accordingly, the stacking structure with the spacer protective structure shielding the top wafer or dies can be more robust, thus leading to improved electrical performance and better reliability of the semiconductor device.

In some embodiments of the present disclosure, a stacking structure comprising a first die, a second die, a spacer protective structure and an anti-bonding layer is provided.

The first die has a first bonding structure and the first bonding structure comprises contact pads. The second die has a second bonding structure. The second die is stacked on the first die, and the second bonding structure is bonded with the first bonding structure. The spacer protective structure is disposed over the first die and surrounds the second die. The spacer protective structure covers sidewalls of the second die. The anti-bonding layer is disposed over the first die and located between the spacer protective structure and the first die.

In some embodiments of the present disclosure, a method for forming a stacking structure is described. A first wafer with a first bonding structure is provided. The first wafer has at least one first bonding region and at least one first non-bonding region. An anti-bonding layer is formed in the at least one first non-bonding region of the first wafer and covers top surfaces of contact pads of the first bonding structure. A second wafer with a second bonding structure is provided. The second wafer has at least one second bonding region and at least one second non-bonding region. The second bonding structure of the second wafer is bonded with the first bonding structure of the first wafer. Grooves are formed in the second wafer between the at least one second bonding region and the at least one second non-bonding region. The at least one second non-bonding region of the second wafer is removed and the anti-bonding layer in the at least one first non-bonding region of the first wafer is exposed. A material layer is formed covering the remained second wafer and the anti-bonding layer in the at least one first non-bonding region of the first wafer. The material layer is etched to form a spacer protective structure surrounding the remained second wafer and at least a portion of the anti-bonding layer is removed to expose the top surfaces of the contact pads.

In some embodiments of the present disclosure, a method for forming a stacking structure is described. A first wafer with a first bonding structure is provided. The first wafer has at least one first bonding region and at least one first non-bonding region. The at least one first non-bonding region of the first wafer is etched to form openings exposing contact pads of the first bonding structure. An anti-bonding layer is formed within the openings in the at least one first non-bonding region of the first wafer to cover top surfaces of the contact pads of the first bonding structure. A second wafer with a second bonding structure is provided. The second wafer has at least one second bonding region and at least one second non-bonding region. The second wafer is bonded onto the first wafer. The at least one second non-bonding region of the second wafer is removed to expose the anti-bonding layer on the at least one first non-bonding region of the first wafer. A material layer covering the remained second wafer and the anti-bonding layer on the at least one first non-bonding region of the first wafer is formed. The material layer is etched to form a spacer protective structure surrounding the remained second wafer and remove at least a portion of the anti-bonding layer to expose the top surfaces of the contact pads in the at least one first non-bonding region of the first wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacking structure, comprising:
a first die, having a first bonding structure, wherein the first bonding structure comprises contact pads;
a second die, having a second bonding structure, wherein the second bonding structure comprises second bonding elements embedded in a second dielectric material, and at least one seal ring structure embedded within the second dielectric material, arranged along a periphery of the second die and surrounding the second bonding elements, wherein the second die is stacked on the first die, and the second bonding structure is bonded with the first bonding structure;
a spacer protective structure, disposed over the first die and surrounding the second die, wherein the spacer protective structure covers sidewalls of the second die; and
an anti-bonding layer, disposed over the first die and located between the spacer protective structure and the first die, wherein the anti-bonding layer is in physical contact with the spacer protective structure and the first bonding structure of the first die.

2. The structure of claim 1, wherein the first bonding structure further comprises first bonding elements embedded in a first dielectric material.

3. The structure of claim 2, wherein the second bonding structure is bonded with the first bonding structure through the bonding of the first and second bonding elements and the bonding of the first and second dielectric materials.

4. The structure of claim 1, wherein top surfaces of the contact pads are exposed from the first bonding structure.

5. The structure of claim 1, wherein top surfaces of the contact pads are exposed from the first bonding structure and a portion of the contact pads is covered by the anti-bonding layer.

6. The structure of claim 1, wherein a material of the anti-bonding layer comprises chromium or graphene.

7. The structure of claim 1, wherein a material of the spacer protective structure comprises silicon nitride, silicon oxynitride or a combination thereof.

8. A stacking structure, comprising:
a first die, having a first bonding structure, wherein the first die comprises a bonding region and a non-bonding region, and the first bonding structure comprises contact pads and first bonding elements embedded in a first dielectric material, the contact pads are located in the non-bonding region, the first bonding elements are located in the bonding region;
a second die, having a second bonding structure, wherein the second bonding structure comprises second bonding elements embedded in a second dielectric material, and the second die is stacked on the first die to cover the bonding region while the non-bonding region is exposed, and the second bonding structure is bonded with the first bonding structure within the bonding region;
a spacer protective structure, disposed over the first die and surrounding the second die, wherein the spacer protective structure covers sidewalls of the second die and exposes portions of the non-bonding region of the first die; and an anti-bonding layer, disposed on the first die, over the non-bonding region of the first die, and located between the spacer protective structure and the first die.

9. The structure of claim 8, wherein the second bonding structure is bonded with the first bonding structure at the bonding region through the bonding of the first and second bonding elements and the bonding of the first and second dielectric materials.

10. The structure of claim 8, wherein the second bonding structure further comprises at least one seal ring structure embedded within the second dielectric material, arranged along a periphery of the second die and surrounding the second bonding elements.

11. The structure of claim 8, wherein top surfaces of the contact pads are exposed from the first dielectric layer of the first bonding structure.

12. The structure of claim 8, wherein top surfaces of the contact pads are exposed from the first dielectric layer of the first bonding structure and a portion of the contact pads is covered by the anti-bonding layer.

13. The structure of claim 8, wherein a material of the anti-bonding layer comprises chromium or graphene, and a material of the spacer protective structure comprises silicon nitride, silicon oxynitride or a combination thereof.

14. The structure of claim 8, wherein the bonding region includes an input/output (I/O) region, and the contact pads comprises I/O pads, bump pads or bond pads.

15. A stacking structure, comprising:
a bottom die, having a first bonding structure comprising contact pads;
a top die, having a second bonding structure, wherein the top die is stacked on the bottom die without covering top surfaces of the contact pads of the bottom die, and the second bonding structure is hybrid-bonded with the first bonding structure for electrically connecting the top and bottom dies;
a spacer protective structure, disposed on the bottom die and surrounding the top die, wherein the spacer protective structure covers sidewalls and a top surface of the top die; and
an anti-bonding layer, disposed over the bottom die and located between the spacer protective structure and the bottom die, wherein a top surface of the anti-bonding layer levels with a top surface of the first bonding structure.

16. The structure of claim 15, wherein a portion of the top surfaces of the contact pads is covered by the anti-bonding layer.

17. The structure of claim 15, wherein a material of the anti-bonding layer comprises chromium or graphene.

18. The structure of claim 15, where the second bonding structure comprises second bonding elements embedded in a second dielectric material, and at least one seal ring structure embedded within the second dielectric material, arranged along a periphery of the top die and surrounding the second bonding elements.

19. The structure of claim 1, wherein the first die further comprises:
a semiconductor substrate;
an insulation layer located on the semiconductor substrate;
semiconductor devices and metallization structures embedded in the insulation layer; and
wherein the first bonding structure is located over the insulation layer.

20. The structure of claim 19, wherein the first bonding structure is sandwiched in between the insulation layer and the second bonding structure.

* * * * *